United States Patent [19]

Pan

[11] 4,417,947
[45] Nov. 29, 1983

[54] EDGE PROFILE CONTROL DURING PATTERNING OF SILICON BY DRY ETCHING WITH CCL4-O2 MIXTURES

[75] Inventor: Alfred I. Pan, San Jose, Calif.

[73] Assignee: Signetics Corporation, Sunnyvale, Calif.

[21] Appl. No.: 398,742

[22] Filed: Jul. 16, 1982

[51] Int. Cl.³ .......................................... H01L 21/308
[52] U.S. Cl. .................................. 156/643; 156/646; 156/657; 156/659.1; 156/662; 204/192 E; 252/79.1
[58] Field of Search ............ 156/643, 657, 646, 659.1, 156/662; 204/192 E; 252/79.1

[56] References Cited

U.S. PATENT DOCUMENTS 4,352,724 10/1982 Sugishima et al. ............ 204/192 E
4,383,885 5/1983 Maydan et al. ...................... 156/643

FOREIGN PATENT DOCUMENTS 5021573 2/1978 Japan ................................... 156/643
56-87666 7/1981 Japan ................................... 156/643
5125838 10/1981 Japan ................................... 156/643

OTHER PUBLICATIONS

Kitcher et al., "Etch Gas ... Structures", IBM Technical Disclosure Bull., vol. 22, No. 10, (3/1980), p. 4513.
International Publication No. WO81/02947—Oct. 15, 1981.
Paraszczak et al., "Comparison ... Silicon", J. Vacuum Science Technology, vol. 19, No. 4, (11/81), pp. 1412–1417.
Korman, "Polysilicon ... -O2 Plasma", J. Vacuum Science Technology, vol. 20, No. 3, (3/82), pp. 476–479.
Bondur, "CF4 ... System", J. of Electrochemical Society, vol. 126, No. 2, (2/79), pp. 226–231.
Schwatz et al., "Competitive ... Plasma", J. of Electrochemical Society, vol. 126, No. 3, (3/79), pp. 464–469.

Primary Examiner—Jerome W. Massie
Attorney, Agent, or Firm—J. A. Dinardo; R. J. Meetin; T. A. Briody

[57] ABSTRACT

The edge profile of a silicon layer is shaped to have a gradual incline considerably less than 90° by continuously reducing the amount of oxygen mixed with carbon tetrachloride in a reactive ion etching environment. The etching mode varies from complete isotropic etching when the amount of oxygen is maximum, to complete anisotropic etching when the oxygen content is zero.

12 Claims, 23 Drawing Figures

CCl₄ 150sccm, CONSTANT PUMP SPEED, 2 Kw

NO OXYGEN 40 sccm O₂

80 sccm O₂

POLY 1 ETCH

POLY 1 OXIDATION

POLY 2 DEPOSITION

POLY 2 ETCH

EDGE PROFILE CONTROL DURING PATTERNING OF SILICON BY DRY ETCHING WITH CCL$_4$-O$_2$ MIXTURES

BACKGROUND OF THE INVENTION

This invention relates to fine line patterning of semiconductor integrated circuits, and more particularly to a method of forming minute patterns in silicon by dry etching, such as by means of a chemical reactant in plasma form.

As the line geometry of semiconductor integrated circuit devices becomes smaller, there is a trend toward utilizing plasma dry etching processes instead of wet chemical etching processes. For more precise line width control the etching process should be anisotropic. In anisotropic etching of silicon, for example, the process of etching proceeds in depth only, in a vertical direction relative to the horizontal surface of the silicon wafer. In isotropic etching, in contrast, the silicon material etches both laterally and vertically, with the lateral component of etching producing an undercutting of the silicon surface beneath the masking material.

While anisotropic etching is preferred for obtaining more precise line width control, the sharp profile associated with the abrupt vertical etched wall which makes a 90° angle with the horizontal silicon surface gives rise to many severe manufacturing problems, such as those associated with step coverage, oxide overhang, residual ribbon formation, and photoresist bridging, to mention a few. These problems can be alleviated to a considerable extent by shaping the edge profile of the etched silicon so that it has a flat, inclined slope considerably less than 90° relative to the horizontal silicon surface.

SUMMARY OF THE INVENTION

In accordance with the invention, a method is provided for selectively etching a silicon surface of an integrated circuit component in a controlled manner by varying the degree of undercutting of the surface. A chemically reactive plasma environment is created from a gaseous medium containing two constituents. A first one of the constituents has the property of causing the silicon to etch anisotropically. The second constituent, when present with the first constituent, has the property of causing undercutting of the silicon, with the degree of undercutting increasing with increasing proportion of the second constituent. The silicon is subjected to the gaseous medium containing both constituents while the proportion of the second constituent is varied to control the etching of the silicon between a mode that is completely anisotropic and one that is completely isotropic.

By completely anisotropic is meant that the etching is predominantly in the vertical direction and there is little or no undercutting in the lateral direction. By completely isotropic is meant that the etching is uniform in all directions, and the undercutting in the lateral direction is equal to the vertical component of etching.

In accordance with a sepcific embodiment, the first constituent is carbon tetrachloride (CCl$_4$) and the second constituent is oxygen (O$_2$). When the etching process begins the carbon tetrachloride is present in the ratio of 150 parts to 80 parts oxygen, and the etching of silicon is completely isotropic. While the etching process continues, the proportion of oxygen is gradually reduced until there is no longer any oxygen present, at which time the etching process is completely anisotropic. The process is terminated at that point. As a result of gradually varying the proportion of the two gaseous constituents during the etching process, the edge profile of the etched silicon surface has a flat, uniform slope that is inclined considerably less than 90° relative to the horizontal silicon surface.

International Publication No. W081/02947, published Oct. 15, 1981, discloses a method of controlling undercutting during plasma etching of silicon by mixing gases. However, in that reference, a fluorine-containing compound is used as the single constituent in a plasma etching medium to achieve complete isotropic etching, rather than anisotropic etching. The amount of undercutting is reduced by mixing chlorine with the fluorine-containing compound, and complete anisotropic etching results when the plasma etching medium contains 100% chlorine. The reference does not disclose a process for shaping the profile of the etched silicon surface so that it has a flat incline considerably less than 90% relative to the horizontal silicon surface.

DETAILED DESCRIPTION OF THE PREFERRED EMBODIMENT

Figure 1:
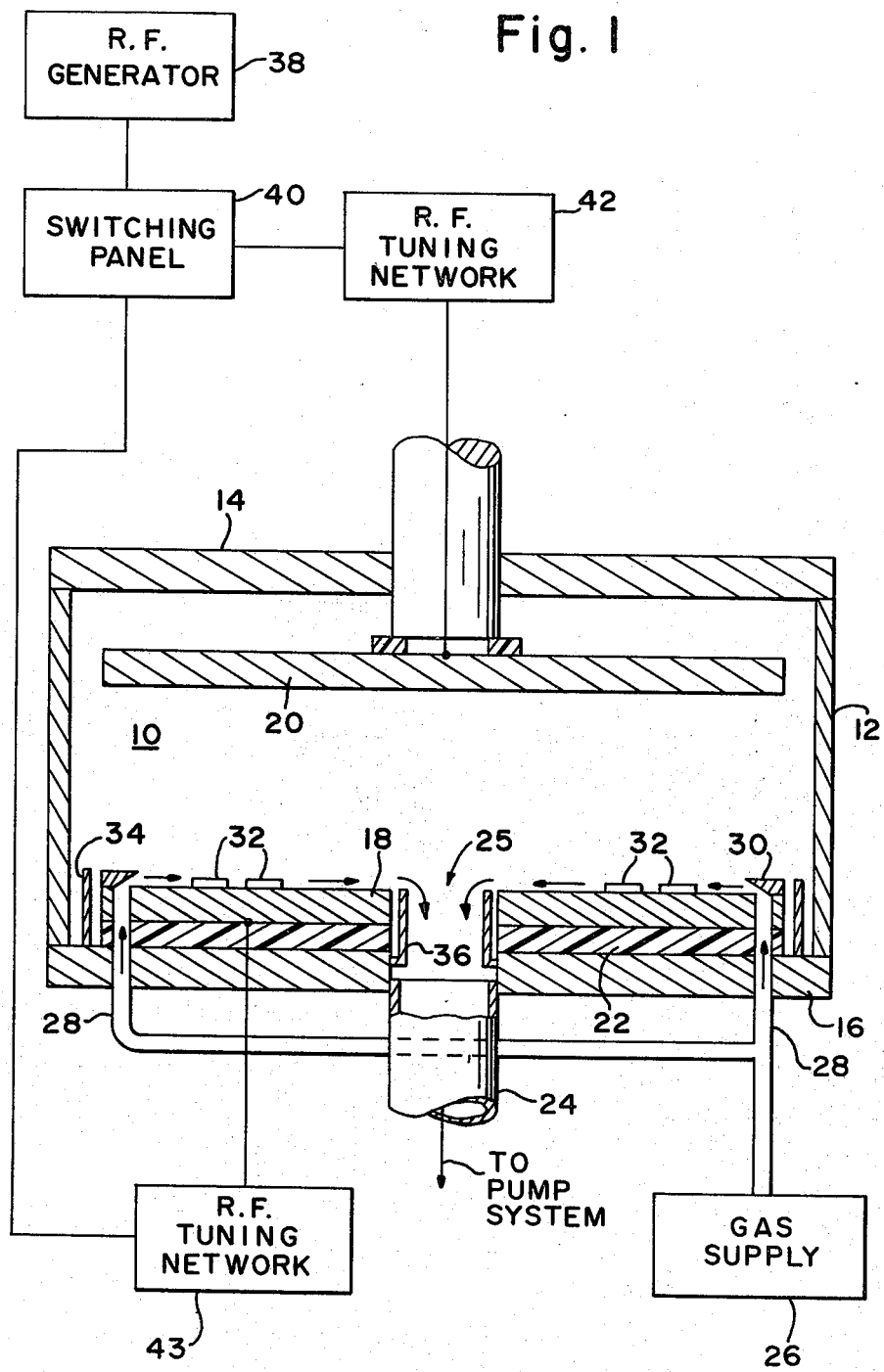
FIG. 1 is a diagrammatic view of a chemically reactive plasma etching apparatus which can be used for carrying out the method according to the invention.

Reference is now made to FIG. 1 which shows a diagram of a reactive plasma etching apparatus for carrying out the method according to the invention. A main plasma chamber 10 is formed by a cylindrical wall 12 closed at both ends thereof by a top end plate 14 and a bottom end plate 16. The chamber 10 houses a lower electrode 18 and an upper electrode 20 spaced there-from. A reactive plasma is produced between the electrodes 18 and 20 when a suitable gas is introduced within the chamber 10 and a source of radio frequency energy is applied across the electrodes 18 and 20.

The lower electrode 18 is electrically insulated from the bottom plate 16 by a spacer 22 of insulating material, such as Teflon. An exhaust gas outlet 24, communicating with the plasma chamber 10 through a central opening 25 passing through the bottom plate 16, the spacer 22, and the lower electrode 18, is connected to an exhaust pump system, not shown, for evacuating and maintaining the chamber 10 at the required low gas pressure. Gas for the plasma is furnished by a gas supply 26 through two conduits 28 entering the chamber 10 adjacent to the cylindrical wall 12. A gas distribution ring 30 surrounding the lower electrode 18 is used to deflect the gas stream emanating from the conduits 28 so that the gas flows laterally across the top surface of the lower electrode 18 where the semiconductor wafers 32 are positioned to receive the flow of gas. An outer dark space shield ring 34 surrounds the outer periphery of the lower electrode 18, and a smaller inner dark space shield ring 36 surrounds the inner surface of the lower electrode 18 facing the central opening 25.

Power to generate the plasma is supplied from an RF generator 38. Typically, the RF generator 38 provides 3 kilowatts of power output at 13.56 MHz. The power is switched optionally to the upper electrode 20 by a switching panel 40 coupling into an RF tuning network 42, or to the lower electrode 18 by the switching panel 40 coupling into an RF tuning network 43. The upper electrode 20 is adjustable vertically to vary its spacing from the lower electrode 18.

For reactive ion etching the RF power is supplied to the lower electrode 18 and the upper electrode 20 is grounded. For plasma etching power is supplied to the upper electrode 20 and the lower electrode 18 is grounded. In plasma etching, the etching process is accomplished by chemical reaction only. In reactive ion etching, the etching process is accomplished both by chemical reaction and by physically enhanced processes by way of ionic bombardment. Either plasma etching or reactive ion etching may be used to carry out the process of the invention. However, in the specific example for which graphical results are given the process used was that of reactive ion etching.

The gas or gas mixture required for the reactive plasma etching process is furnished by the gas supply 26. The gas supply 26 may include a source of carbon tetrachloride gas and a source of oxygen. The gas supply may also include other kinds of gases that may be necessary to etch other materials besides silicon during the manufacture of the integrated circuit devices.

Figure 2:
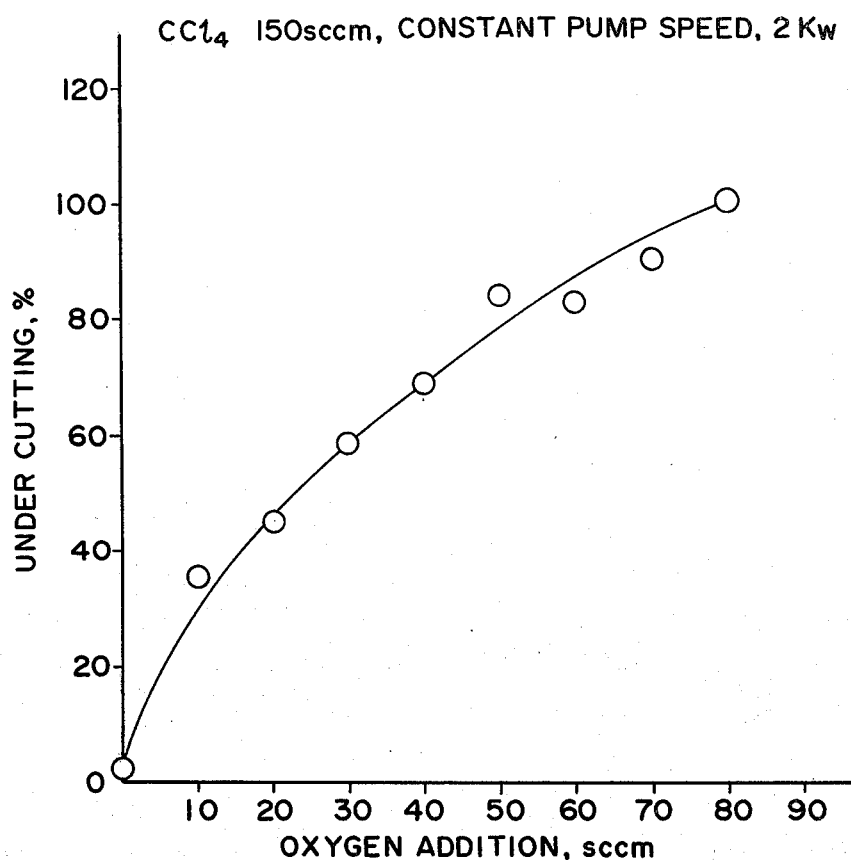
FIG. 2 is a graph showing the variation in undercutting of polysilicon with the proportion of oxygen added to carbon tetrachloride as a chemically reactive plasma.

Reference is now made to FIG. 2 which is a graph showing the variation in the amount of undercutting of N doped polysilicon as a function of the amount of oxygen added to a plasma environment of carbon tetrachloride. In this example, the flow rate of carbon tetrachloride was maintained constant at 150 SCCM, which stands for standard cubic centimeters per minute. Standard means that the gas flow was measured under the standard condition of one atmospheric pressure and 25° C. temperature. The polysilicon coated samples were etched at each of nine different flow rates of oxygen, also measured in SCCM. Samples were etched at 80, 70, 60, 50, 40, 30, 20 10, and 0 SCCM flow rates of oxygen. At each flow rate value measurements were made of the ratio of undercutting, or etching in the lateral direction, to the amount of etching in the vertical direction, and on the graph this ratio is expressed in percent of undercutting. Samples tested at 80 SCCM of oxygen showed 100% undercutting, which means that the etching was completely isotropic. Samples tested at 60 SCCM of oxygen showed about 80% undercutting. At 40 SCCM of oxygen the samples showed about 70% undercutting. At 20 SCCM of oxygen the samples showed about 45% undercutting. With no oxygen present the samples showed no lateral etching, which means the etching was completely anisotropic.

While the graph of FIG. 2 shows the experimental results of etching N doped polysilicon, it is expected that similar results will be obtained with N doped monosilicon and with P doped or undoped monosilicon and polysilicon. However, the N doped silicon materials will etch faster than the undoped or P doped silicon materials. For purposes of the invention, however, the term silicon is meant to encompass both monocrystalline and polycrystalline silicon, whether doped N type or P type, or whether it be intrinsic.

Figure 3A:
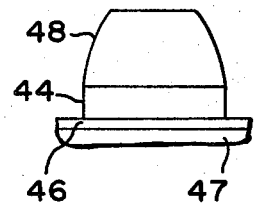
FIGS. 3A through 3C are sectional views showing the effects of oxygen on the undercutting of polysilicon.
Figure 3B:
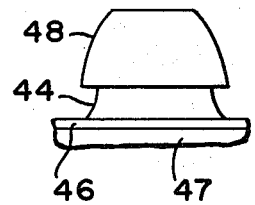
Figure 3C:
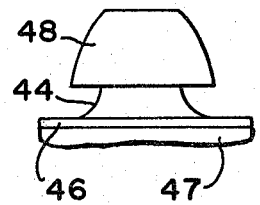

FIGS. 3A to 3C show the effects of etching a polysilicon layer with different proportions of oxygen added to carbon tetrachloride. In each of the FIGS. 3A through 3C, the polysilicon layer 44 is deposited on a silicon dioxide layer 46 overlying a silicon substrate 47 and is masked during etching by a photoresist layer 48. FIG. 3A shows the effect of etching polysilicon with no oxygen added to 150 SCCM of carbon tetrachloride. FIG. 3B shows the effect of etching polysilicon with 40 SCCM added to 150 SCCM of carbon tetrachloride. FIG. 3C shows the effects of etching polysilicon with 80 SCCM added to 150 SCCM of carbon tetrachloride. In FIG. 3A it will be seen that with pure carbon tetrachloride as the plasma etching gas, the etching is completely anisotropic because the surface of the polysilicon layer 44 is vertical and there is no undercutting or lateral etching. In FIG. 3B, with only 40 SCCM of oxygen added to the carbon tetrachloride, the etching of the polysilicon layer 44 is slightly isotropic, there being about a ratio of 1 to 2 of lateral etching verses vertical etching. In FIG. 3C, with 80 SCCM of oxygen added to the carbon tetrachloride the lateral etching of the polysilicon layer is approximately equal to the vertical etching, so the undercutting is 100%.

A few illustrations will now be described of some of the problems and defects arising from anisotropic etching, and how these problems can be alleviated by shaping the profile of the etched silicon surface so that it has a gradual slope rather than an abrupt vertical slope. In FIGS. 4A through 4D some of the problems associated with step coverage are shown. The same numerals are used to indicate the same parts, wherein 50 is a layer of silicon dioxide on a silicon substrate 47, 52 is a layer of polysilicon that has been deposited on the silicon dioxide layer 50 and etched anisotropically, and 54 is a layer of chemically vapor deposited silicon dioxide that has been deposited over the polysilicon layer 52 and silicon dioxide layer 50.

Figure 4A:
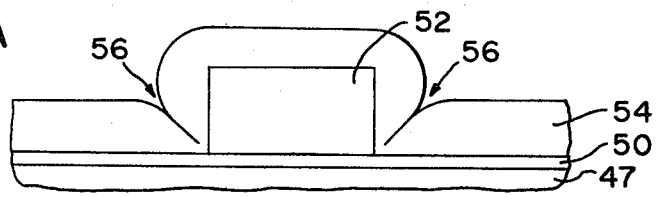
FIGS. 4A through 4C are sectional views showing some of the step coverage defects arising from anisotropic etching of polysilicon.

FIG. 4A shows the formation of crevices 56 at the lowermost corners where the polysilicon layer 52 meets the bottom silicon dioxide layer 50. Crevice formation is undesirable because it may cause discontinuity of the aluminum line deposited on top of it.

Figure 4B:
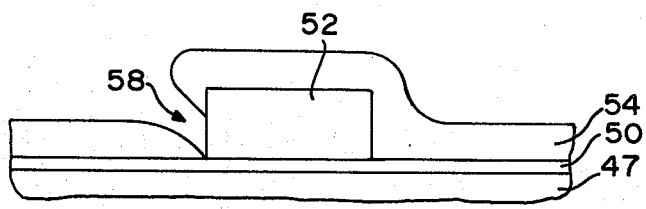

FIG. 4B shows a discontinuity in the layer 54 formed at 58. A discontinuity may result in incomplete passivation and may cause a short circuit.

Figure 4C:
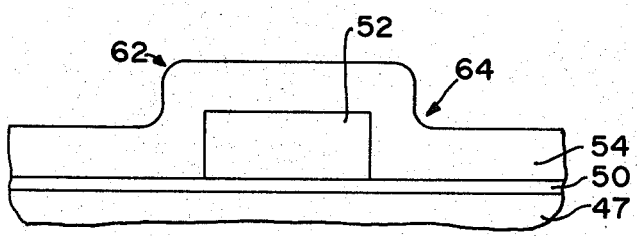

FIG. 4C shows stress concentrations in the layer 54. There is a region 62 of compressive stress concentration at the top corner of the step in layer 54, and a region 64 of tensile stress at the lower corner of the step. Stress concentrations may give rise to fracturing of the layer 54.

The application of a flow glass with a high phosphorus pentoxide content is generally used over sharp polysilicon steps to provide a smooth topography on which to deposite a conducting layer of aluminum. However, the high temperature process involved, usually around 1000° C., will give rise to many undesirable effects. Furthermore, the high content of phosphorus pentoxide in the glass layer may react with water vapor to form an etching composition which attacks the aluminum. An excess amount of phosphorus pentoxide also tends to degrade the adhesion of aluminum to the glass.

Figure 4D:
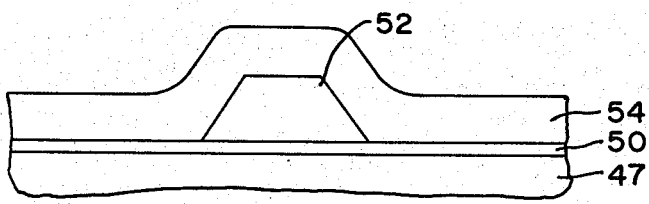
FIG. 4D is a sectional view showing the sloped edge profile of polysilicon etched in accordance with the invention.

The foregoing problems may be overcome by shaping the profile of the polysilicon layer 52 so that it has a gradual inclined slope as shown in FIG. 4D. This profile may be achieved by starting the etching process of the polysilicon layer 52 so that it is completely isotropic. For example, with 150 SCCM of carbon tetrachloride the oxygen content can start off with about 80 SCCM, as described in the test results of FIG. 2. Then the amount of oxygen can be decreased gradually during the etching process so as to decrease the amount of undercutting until there is no oxygen present. At this point, when the etching it completely anisotropic, the process is terminated.

Figure 5A:
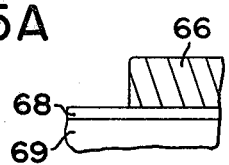
FIGS. 5A through 5D are sectional views showing some of the effects of oxidation overhang resulting from anisotropic etching of polysilicon.
Figure 6A:
FIGS. 6A through 6D are sectional views showing how the defects of oxidation overhang shown in FIGS. 5A through 5D are avoided by sloping the edge profile of polysilicon according to the invention.
Figure 5B:
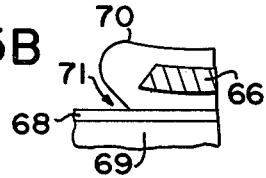
Figure 6B:
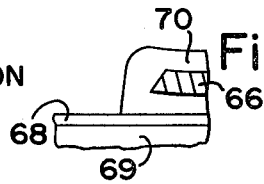
Figure 5C:
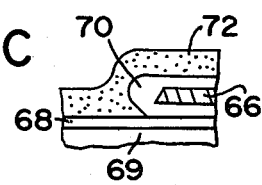
Figure 6C:
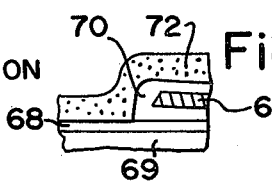
Figure 5D:
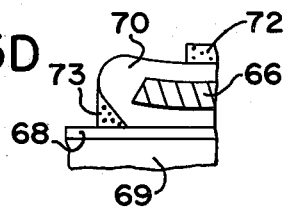
Figure 6D:
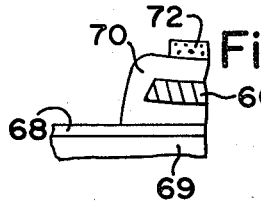

FIGS. 5A through 5D show the adverse effects of oxidation overhang in a double polysilicon layer process caused by anisotropic etching of the first polysilicon layer. FIGS. 6A through 6D show how this defect is avoided by properly shaping the edge profile of the first polysilicon layer. In FIG. 5A, a first polysilicon layer 66 is deposited on a first silicon dioxide layer 68 overlying a silicon substrate 69 and then is anisotropically etched. In FIG. 5B a second silicon dioxide layer 70 is deposited over the first polysilicon layer 66. During this second oxide formation, a re-entrant region 71 forms where the two oxide layers 68 and 70 join together. In FIG. 5C a second polysilicon layer 72 is deposited over the second oxide layer 70, filling in the crevice 71. When the second polysilicon layer 72 is patterned and etched, a filament 73 of polysilicon remains where the re-entrant region 71 was filled in. The filament 73 may give rise to short circuits.

in FIGS. 6A through 6D the same steps in the double polysilicon process are shown for the case where the first polysilicon layer 66 is etched according to the invention by sloping the edge profile thereof. In FIG. 6B there is no re-entrant region formed between the two oxide layers 68 and 70, thereby avoiding the formation of a polysilicon filament, as shown in FIG. 6D.

Figure 7:
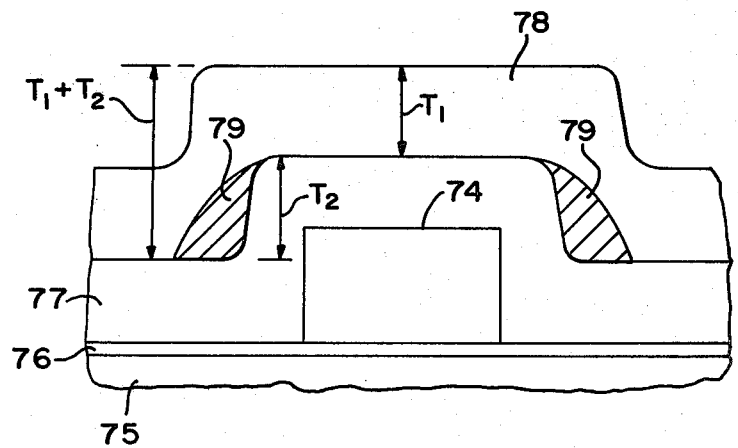
FIG. 7 is a sectional view showing the defect of residual ribbon formation resulting from anisotropic etching of polysilicon.

FIG. 7 shows another defect known as residual ribbon formation, that is caused by anisotropic etching of a polysilicon layer 74 deposited on a silicon dioxide layer 76 overlying silicon substrate 75. A passivation oxide layer 77 is deposited over the polysilicon layer 74 and a conducting layer 78 is deposited on the oxide layer 77. The conducting layer 78 may consist of aluminum or polysilicon. The step height of the oxide layer 77 over the polysilicon layer 74 is denoted as T2 and the thickness of the conducting layer 78 is denoted as T1 in all regions except the regions next adjacent to the side edges where the conducting layer 78 is thicker and is denoted by the thickness T1+T2. When the conducting layer 78 is etched there will remain a ribbon 79 of conducting material, shown as the shaded areas, in the corners on each side of the oxide step 77. The ribbon 79 may be avoided by overetching the conducting layer but this will reduce the line width. Ribbon formation can be avoided without reducing the line width by properly sloping the edge profile of the polysilicon layer 74.

Figure 8A:
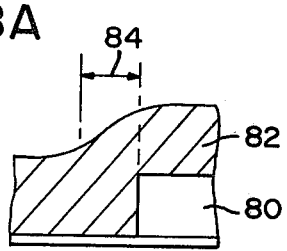
FIGS. 8A and 8B are sectional and plan views, respectively, showing the defect of photoresist bridging resulting from anisotropic etching of polysilicon.
Figure 8B:
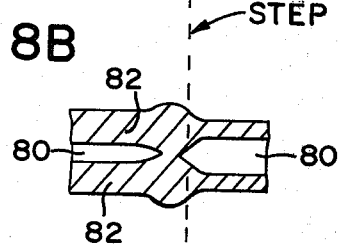

Another defect known as photoresist bridging is shown in FIGS. 8A and 8B. In the cross sectional view of FIG. 8A, the anisotropically etched polysilicon layer 80 is formed with a step and is covered with positive photoresist 82. Adjacent to the edge of the step in the polysilicon layer 80, in the region denoted by the numeral 84, the photoresist 82 is thickest. When the photoresist 82 is exposed through a mask, for example to delineate a line pattern of polysilicon, the light does not penetrate the thickest regions of the photoresist 82. As a result, when the exposed positive photoresist is removed, some of the photoresist in the thickest regions 84 is not removed and forms a bridge between adjacent lines, as shown in the top plan view of FIG. 8B. When the uncovered polysilicon is removed between the photoresist lines, the polysilicon remaining underneath the photoresist bridge will cause a short circuit between adjacent polysilicon lines.

Figure 9A:
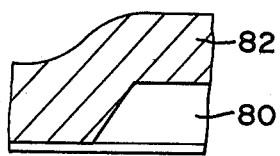
FIGS. 9A and 9B are sectional and plan views, respectively, showing how the defects of photoresist bridging shown in FIGS. 8A and 8B are avoided by sloping the edge profile of polysilicon according to the invention.
Figure 9B:
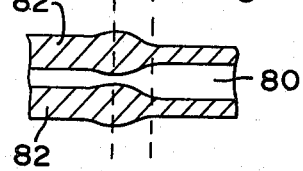

The above defect can be avoided by providing a gradual step in the polysilicon layer 80, as shown in FIG. 9A. In this case the photoresist will be exposed throughout its depth along the inclined edge, and no bridging of photoresist will occur, as shown in FIG. 9B.

The shape of the edge profile of silicon can be varied by continuously varying the amount of oxygen mixed with the carbon tetrachloride. The profile can be a continuous slope, having an angle between 45° and 90°, as already shown and described.

Figure 10:
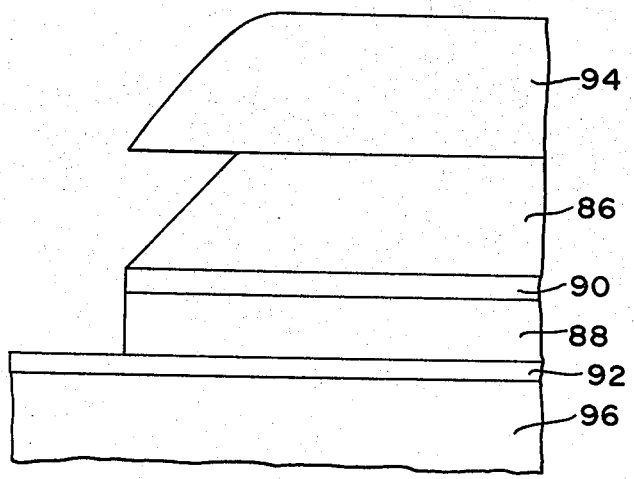
FIG. 10 is a sectional view showing the edge profile of a double polysilicon layer structure resulting from controlled isotropic etching of the top layer followed by complete anisotropic etching of the bottom layer.

In the case of sequential etching of a double polysilicon layer structure, shown in FIG. 10, the top polysilicon layer 86 may be slope etched for good step coverage, while the bottom polysilicon layer 88, which is separated from the top polysilicon layer 86 by an oxide layer 90, may be anisotropically etched for fine line width control. For example the bottom polysilicon layer 88 may be 2500 angstroms thick deposited on a gate oxide layer 92 of 500 angstroms thickness. The interpoly oxide layer 90 may be 1000 angstroms thick and the top polysilicon layer 86 may be 5000 angstroms thick. A photoresist layer 94 is shown over the top polysilicon layer 86 to mask the area where etching is not desired. The gate oxide layer 92 is shown deposited on a silicon substrate 96.

What I claim is:

1. A method for selectively etching a silicon region of an integrated circuit component, the method comprising the steps of:
    forming a mask along a surface of the region such that the mask has at least one edge along which silicon of the region is exposed; and
    subjecting the component to a plasma comprising ions of carbon tetrachloride and oxygen to etch away silicon exposed through the mask while varying the proportion of oxygen in the plasma so as to control the etching between isotropic and anisotropic modes.

2. A method as in claim 1 wherein the proportion of oxygen in the plasma is sufficiently high at the beginning of the step of subjecting that the etching is substantially isotropic at that point.

3. A method as in claim 2 wherein the proportion of oxygen in the plasma at the beginning of the step of subjecting does not significantly exceed the value at which the etching is substantially isotropic.

4. A method as in claim 2 wherein the volume proportion of oxygen in the plasma to that of carbon tetrachloride is approximately one half at the beginning of the step of subjecting.

5. A method as in claim 2 wherein the proportion of oxygen in the plasma is substantially zero at the end of the step of subjecting, whereby the etching is substantially anisotropic at that point.

6. A method as in claim 5 wherein the proportion of oxygen in the plasma is gradually reduced during the step of subjecting, whereby a resulting edge of the region at a location where silicon was etched away and which is adjacent to an unetched surface portion of the region is generally sloped at less than 90° relative to the unetched portion.

7. A method as in claim 5 wherein the proportion of oxygen in the plasma is gradually reduced during an initial part of the step of subjecting, substantially reaches zero at the end of the initial part, and remains there during the remainder of the step of subjecting, whereby a resulting edge of the region at a location where silicon was etched away and which is adjacent to an unetched surface portion of the region comprises a first part adjacent to the unetched portion and generally sloped at less than 90° relative to it and a second part adjacent to the first part and oriented generally orthogonal to the unetched portion.

8. A method as in claim 1 wherein the step of subjecting is performed as a continuous operation without stops during which there is essentially no etching of the region.

9. A method as in claim 8 wherein the proportion of oxygen in the plasma is gradually reduced during the step of subjecting.

10. A method as in claim 1 wherein ions of the plasma are bombarded toward the component during the step of subjecting.

11. A method as in claim 1 wherein silicon of the region is polycrystalline type.

12. A method as in claim 1 wherein silicon of the region is monocrystalline type.

* * * * *